United States Patent
Eriksson et al.

(10) Patent No.: US 12,098,457 B2
(45) Date of Patent: Sep. 24, 2024

(54) TM-Al—O—N COATING LAYERS WITH INCREASED THERMAL STABILITY

(71) Applicant: Oerlikon Surface Solutions AG, Pfäffikon, Pfäffikon (CH)

(72) Inventors: Anders Olof Eriksson, Chur (CH); Siva Phani Kumar Yalamanchili, Sargans (CH); Mirjam Arndt, Wetzlar (DE); Damian Mauritius Holzapfel, Aachen (DE); Jochen Michael Schneider, Aachen (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 454 days.

(21) Appl. No.: 17/436,942

(22) PCT Filed: Mar. 9, 2020

(86) PCT No.: PCT/EP2020/056195
§ 371 (c)(1),
(2) Date: Sep. 7, 2021

(87) PCT Pub. No.: WO2020/178456
PCT Pub. Date: Sep. 10, 2020

(65) Prior Publication Data
US 2022/0170146 A1 Jun. 2, 2022

Related U.S. Application Data
(60) Provisional application No. 62/850,684, filed on May 21, 2019.

(30) Foreign Application Priority Data
Mar. 7, 2019 (DE) .................. 10 2019 105 886.4

(51) Int. Cl.
*C23C 14/06* (2006.01)
*C23C 14/58* (2006.01)

(52) U.S. Cl.
CPC ...... *C23C 14/0641* (2013.01); *C23C 14/0676* (2013.01); *C23C 14/5806* (2013.01)

(58) Field of Classification Search
None
See application file for complete search history.

(56) References Cited

U.S. PATENT DOCUMENTS

| | | | |
|---|---|---|---|
| 2009/0074522 A1 | 3/2009 | Graham et al. | |
| 2013/0052477 A1* | 2/2013 | Lechthaler | C23C 14/0641 428/623 |
| 2018/0023194 A1* | 1/2018 | Pitonak | C23C 28/044 428/336 |

FOREIGN PATENT DOCUMENTS

| | | |
|---|---|---|
| CN | 105112858 A | 12/2015 |
| EP | 1400293 A2 | 3/2004 |

(Continued)

OTHER PUBLICATIONS

R. Raab, et al., "Interfaces in Arc Evaporated Al—Cr—N/Al—Cr—O Multilayers and Their Impact on Hardness," Surface & Coatings Technology, May 16, 2017, pp. 236-242, vol. 324.

*Primary Examiner* — Kim S. Horger

(57) ABSTRACT

Coated substrate comprising a surface coated with a coating comprising at least one coating layer of $(TM_{1-x}Al_x)O_yN_z$ with $(0.75-y) \leq z \leq (1.2-y)$ and $0.6 > y > 0$, exhibiting a solid solution with B1 cubic structure, wherein x is the content of aluminum in atomic fraction if only aluminum and TM are being considered for the determination of the element composition in atomic percentage, and y is the content of oxygen in atomic fraction if only O and N are being considered for the determination of the element composition in atomic percentage, wherein TM is one or more transition metals and (Continued)

Figure 1:
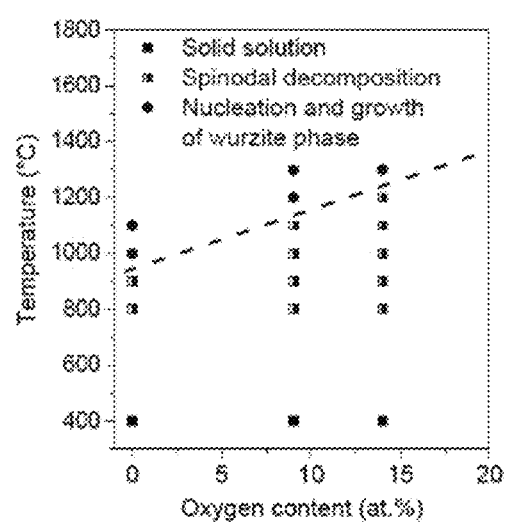

On the left Fig. 1 black and white, On the right Fig. 1 colored $0.05 < x < 0.95$, wherein y correspond to a value of oxygen concentration in the $TM_{1-x}Al_xO_yN_z$ coating layer that produces an increment of the thermal stability in such a manner that no precipitation of w-AlN phase is produced when the coated substrate or at least the coated surface of the coated substrate is exposed to temperatures higher than 1100° C.

10 Claims, 29 Drawing Sheets

(56) References Cited

FOREIGN PATENT DOCUMENTS

| | | | |
|---|---|---|---|
| JP | 2010090892 | A | 4/2010 |
| JP | 2018111828 | A | 7/2018 |
| WO | 2019025106 | A1 | 2/2019 |
| WO | 2019101919 | A1 | 5/2019 |

* cited by examiner

On the left Fig. 1 black and white, On the right Fig. 1 colored

Figure 2:
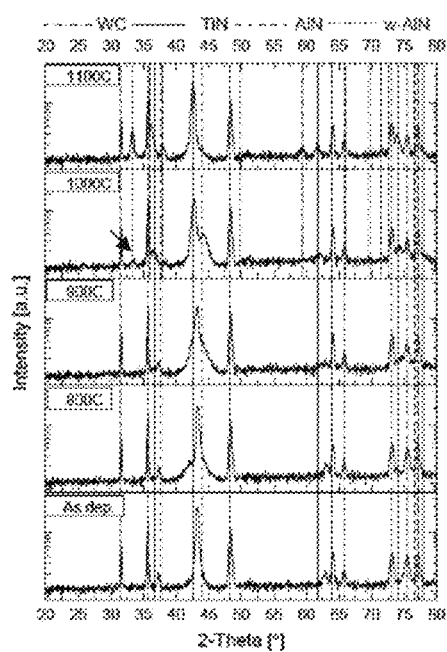

On the left Fig. 2 black and white, On the right Fig. 2 colored

Figure 3:
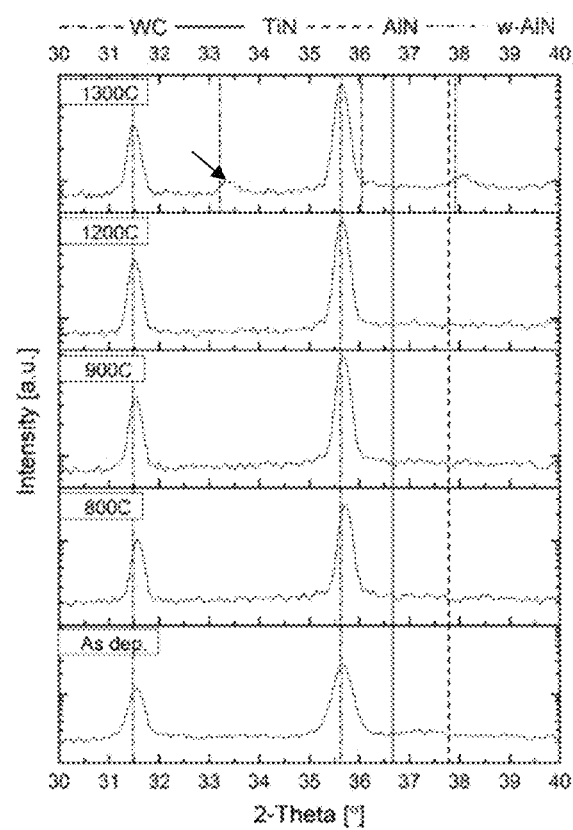

On the left Fig. 3 black and white, On the right Fig. 3 colored

Figure 5:
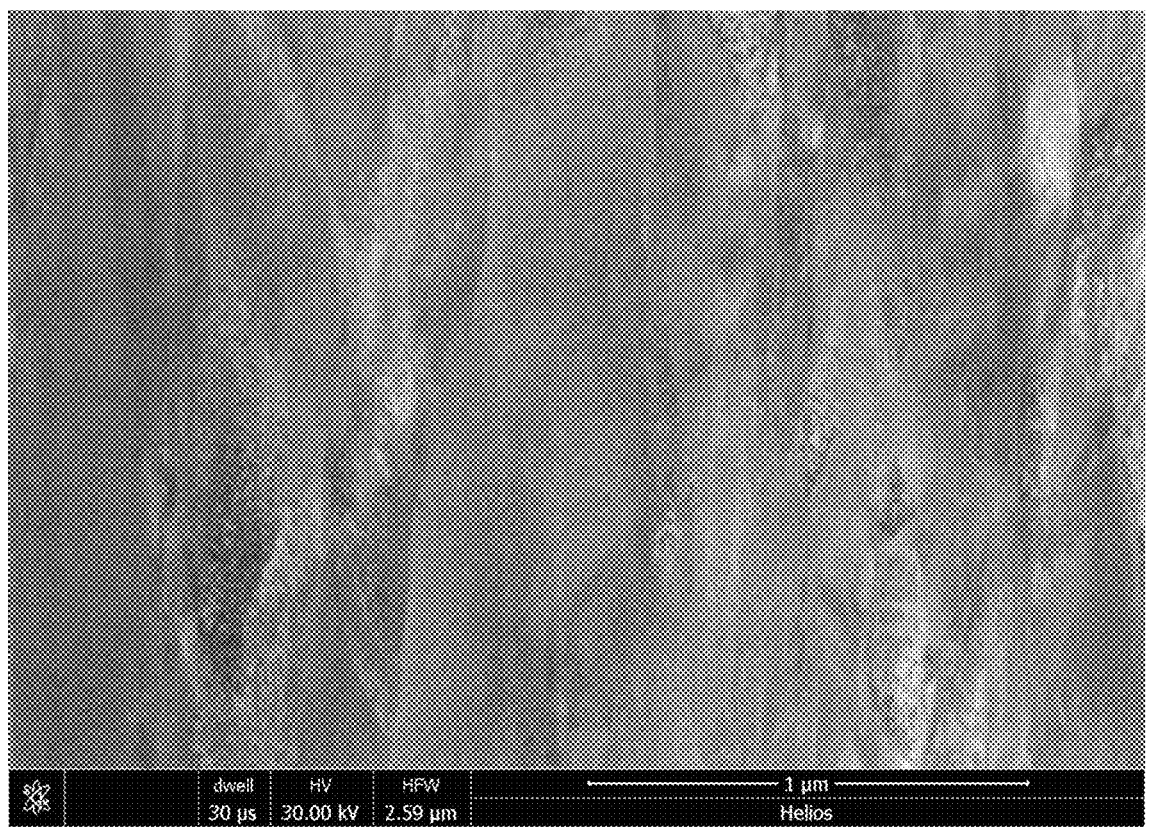

Figure 5: The scale bar corresponds to 1μm.

Figure 6:
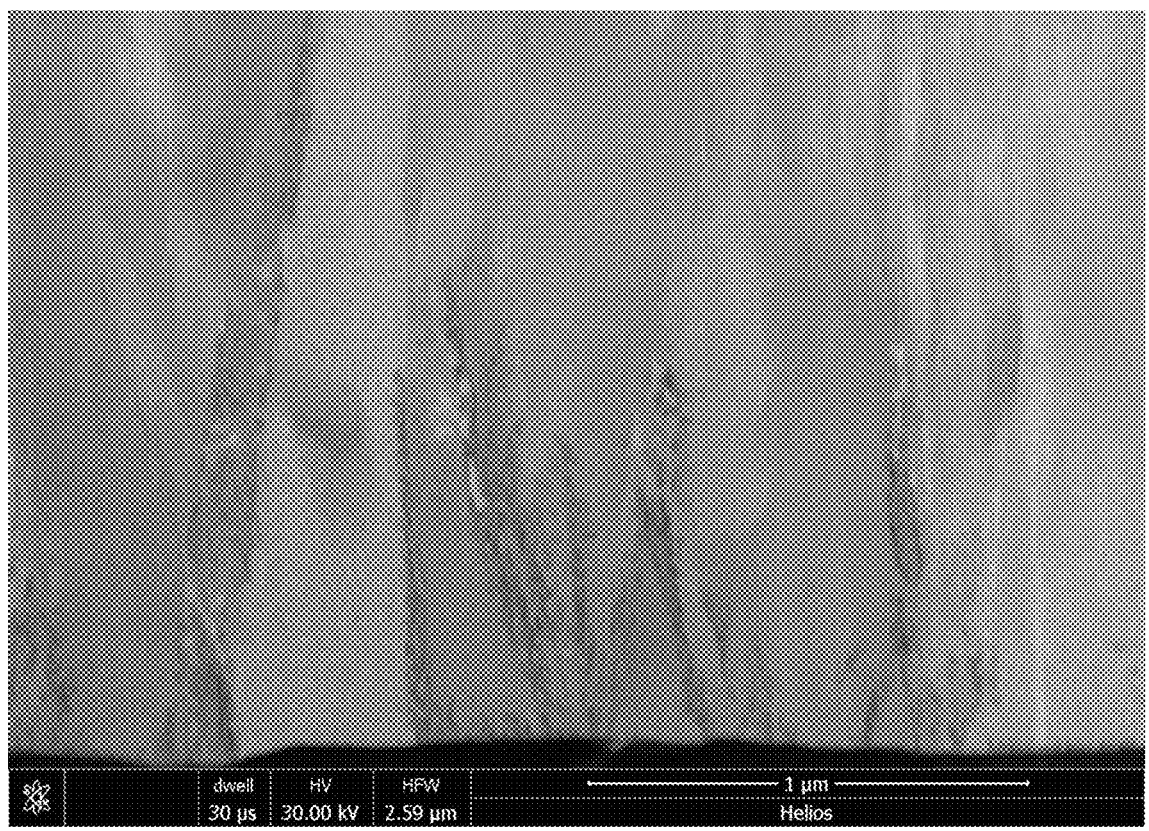

Figure 6: The scale bar corresponds to 1μm.

Figure 7:
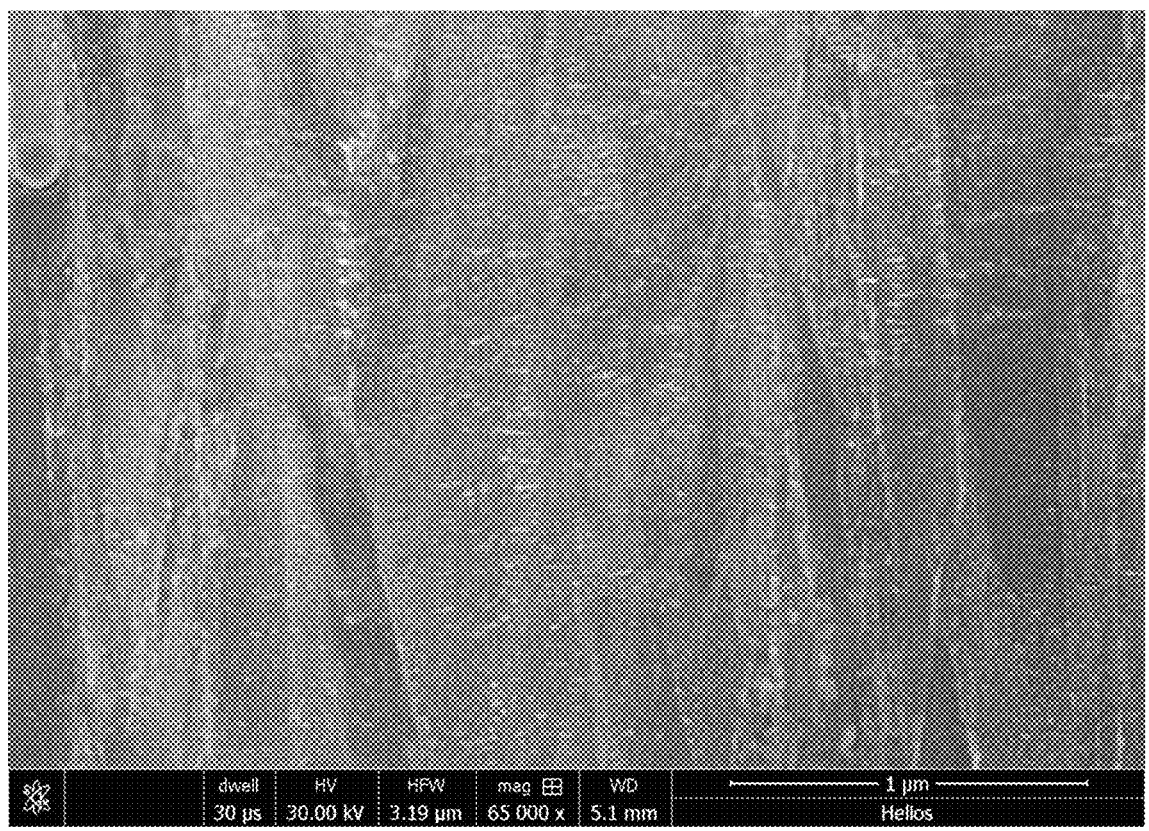

Figure 7: The scale bar corresponds to 1μm.

Figure 8:
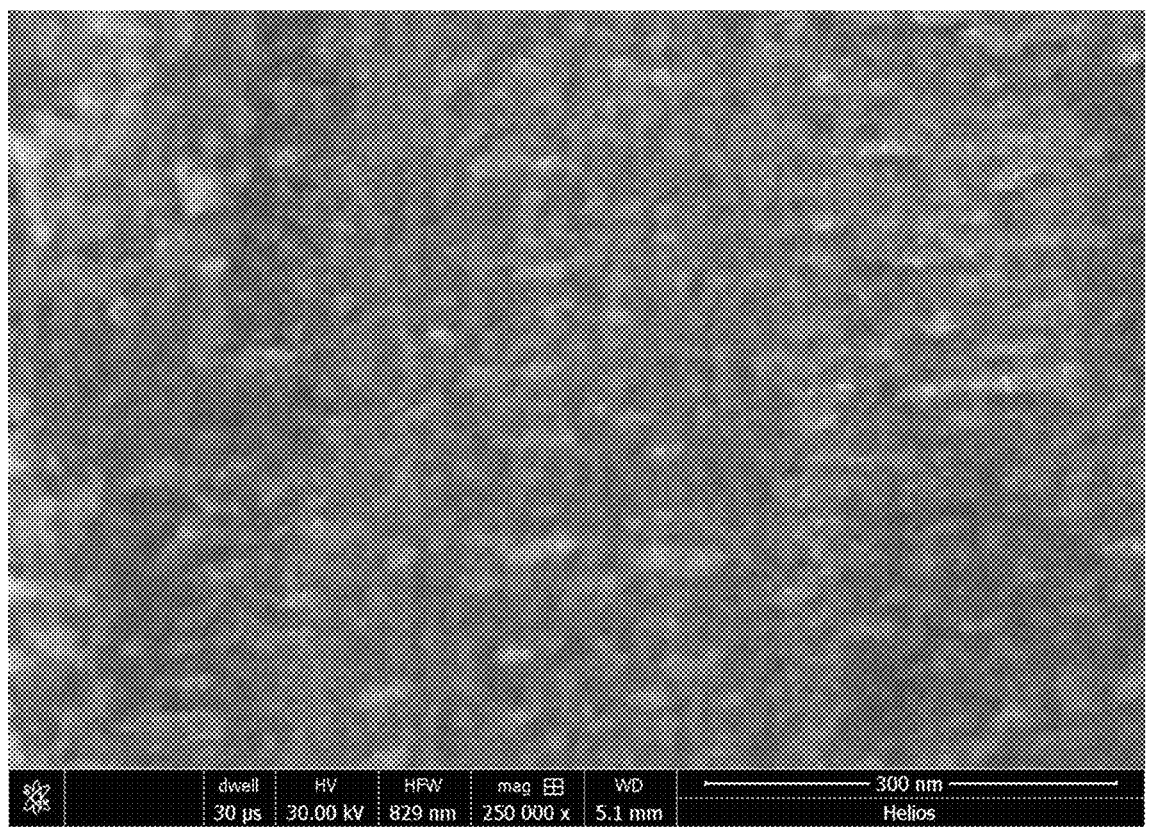

Figure 8: The scale bar corresponds to 300nm.

Figure 9:
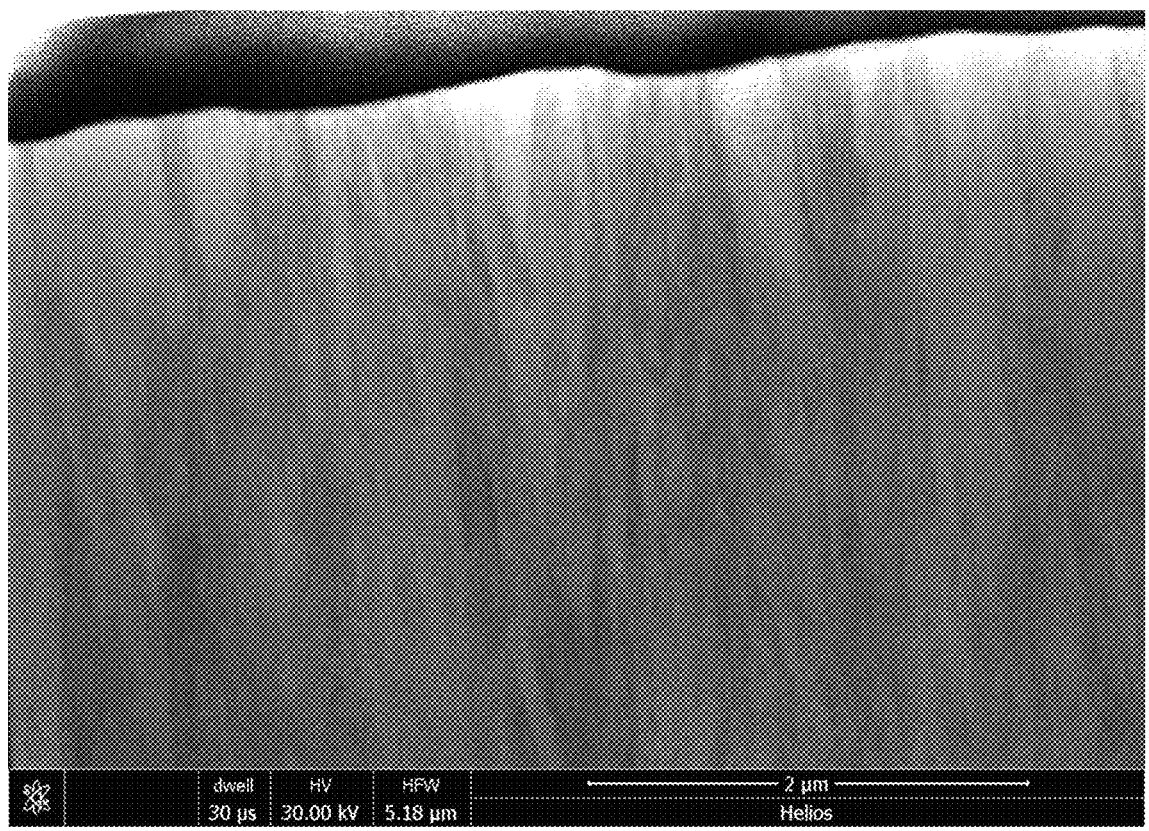

Figure 9: The scale bar corresponds to 2μm.

Figure 10:
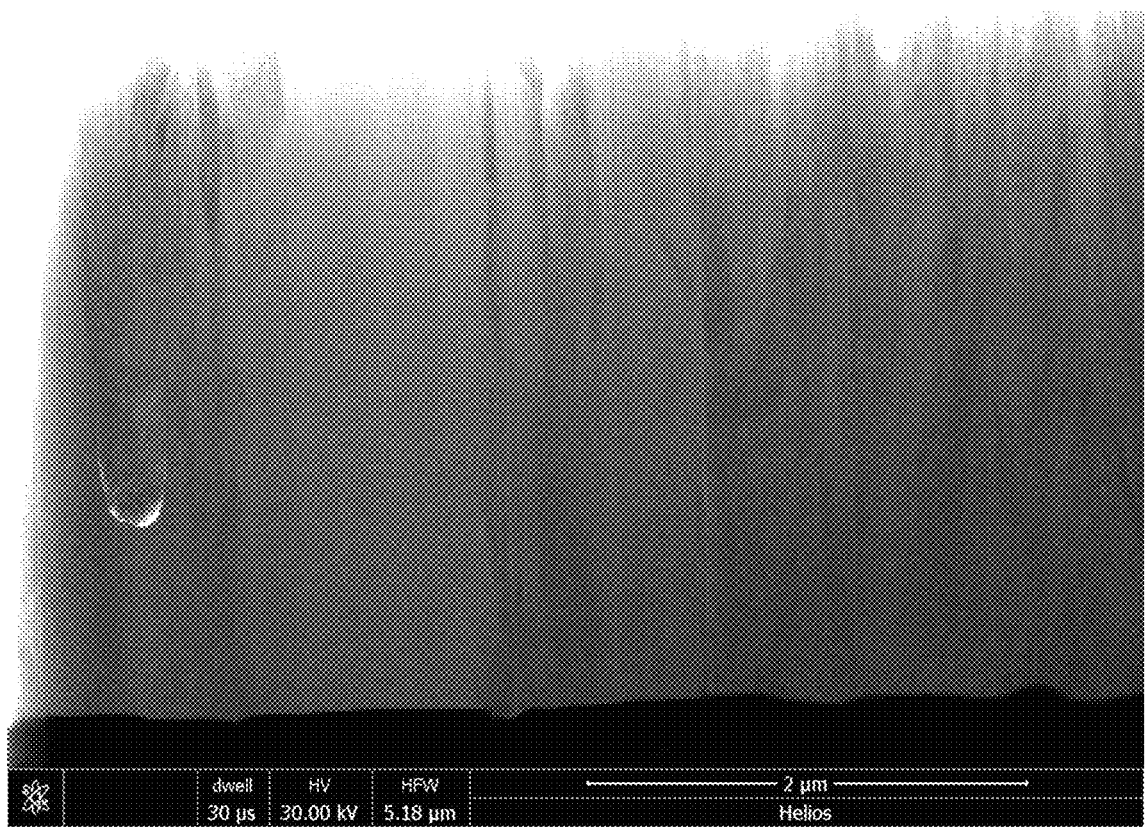

Figure 10: The scale bar corresponds to 2μm.

Figure 11:
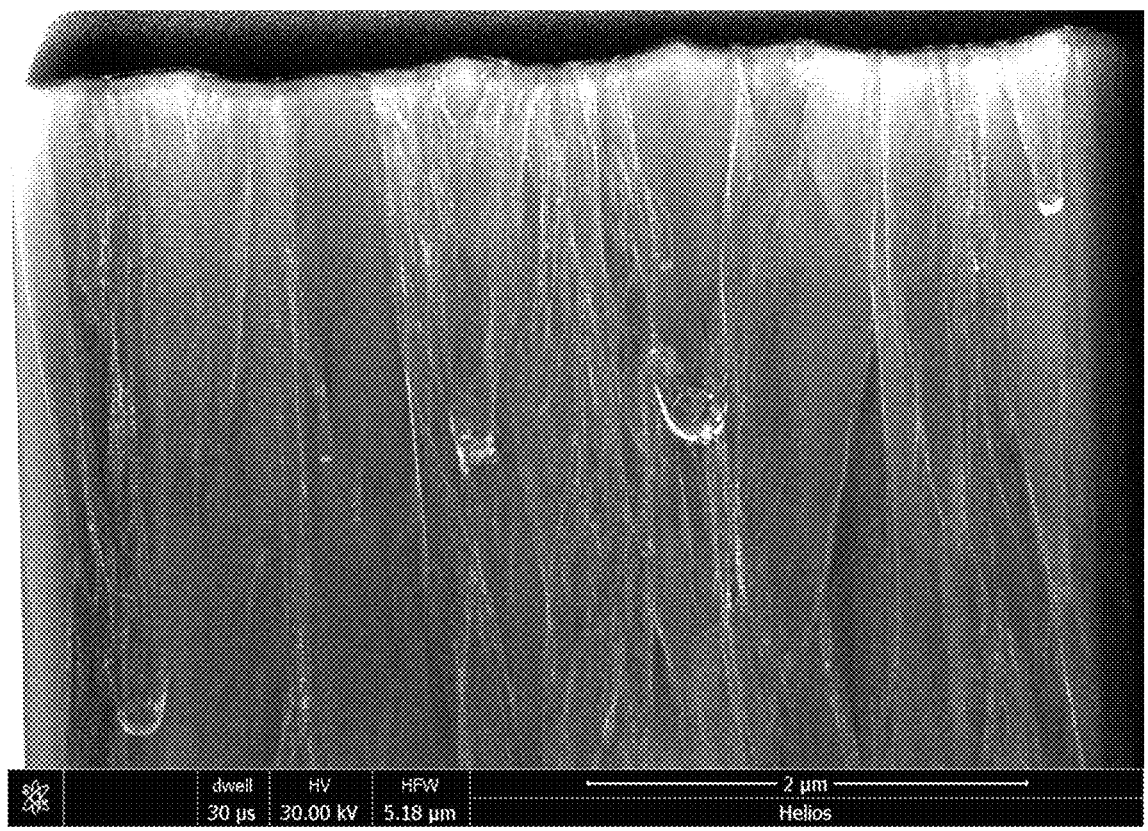

Figure 11: The scale bar corresponds to 2μm.

Figure 12:
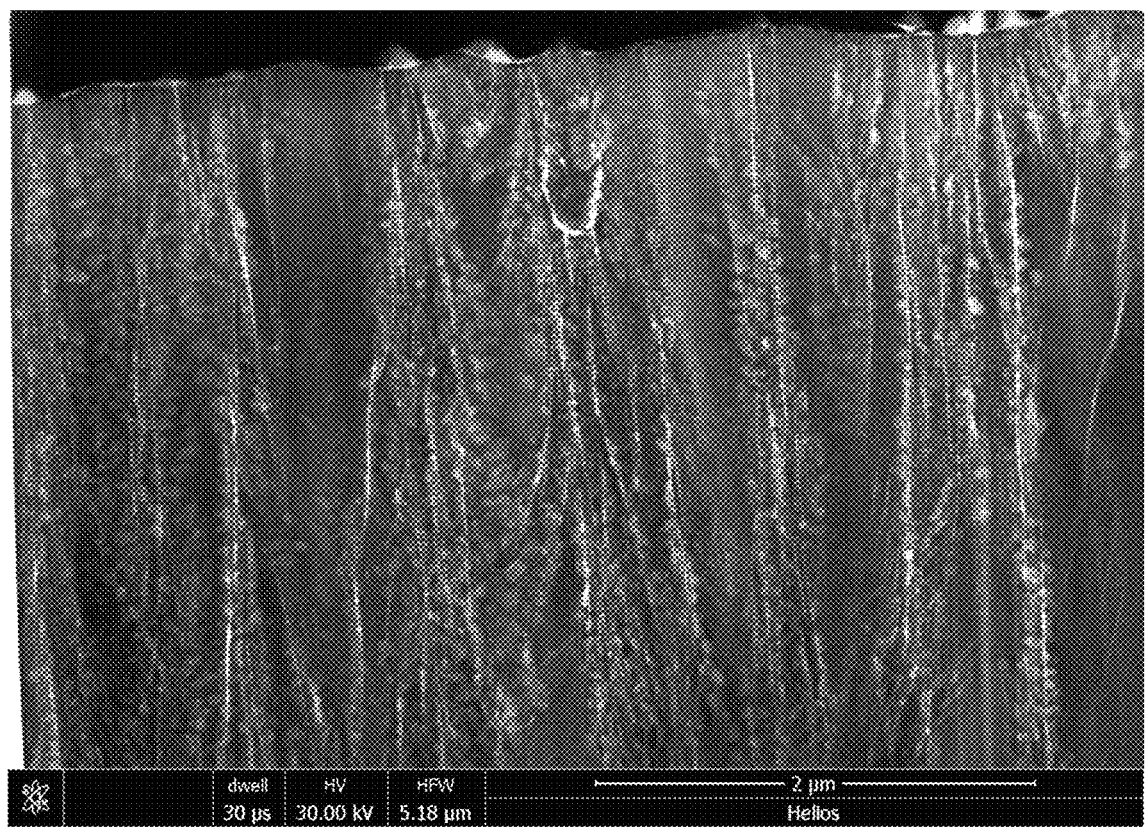

Figure 12: The scale bar corresponds to 2μm.

Figure 13:
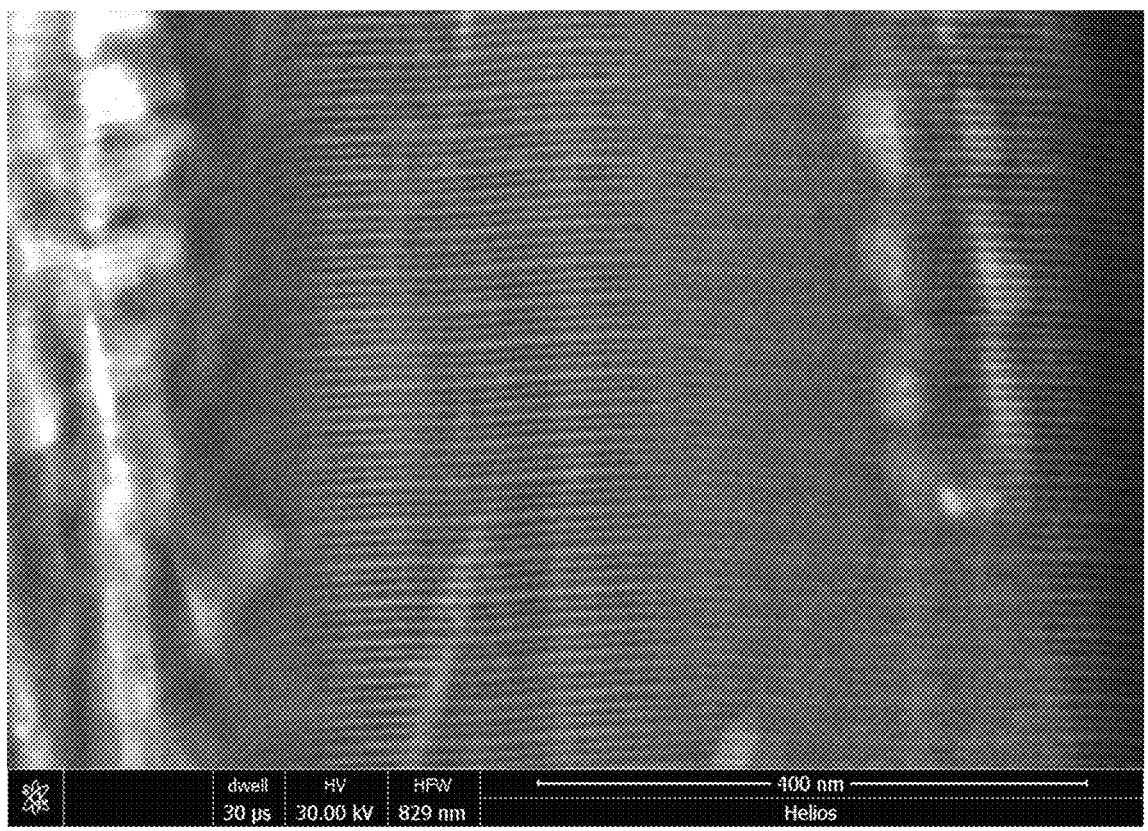

Figure 13: The scale bar corresponds to 400nm

Figure 14:
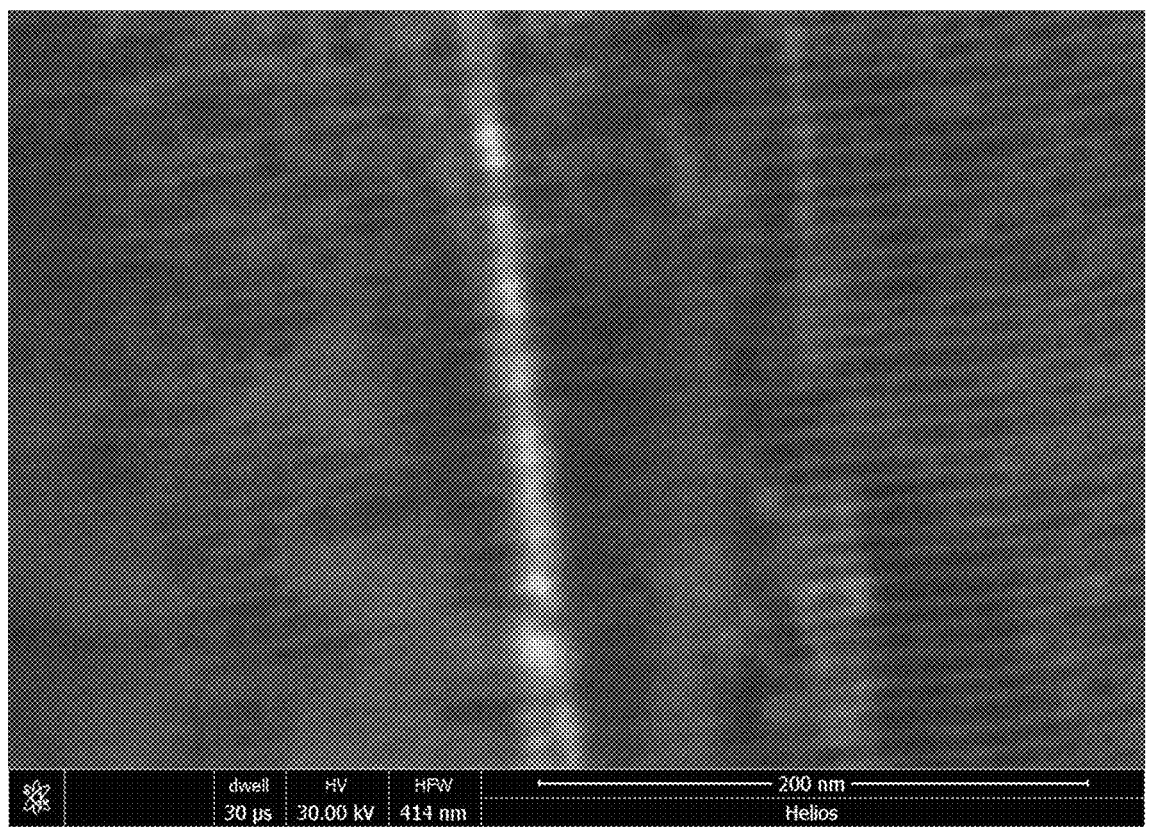

Figure 14. The scale bar corresponds to 200nm.

TM-Al—O—N COATING LAYERS WITH INCREASED THERMAL STABILITY

The present invention relates to a coating comprising at least one coating layer of TM-Al—O—N, exhibiting a solid solution with B1 cubic structure or spinodally decomposed phases with cubic structure, wherein the oxygen concentration in the TM-Al—O—N coating layer produces an increment of the thermal stability in comparison with a $(TM_{1-x}Al_x)N_z$ coating layer whose element composition differs from the element composition of the $(TM_{1-x}Al_x)O_yN_z$ coating layer only in that the $(TM_{1-x}Al_x)N_z$ coating layer does not comprises oxygen, in such a manner that no precipitation of w-AlN phase is produced when the coating is exposed to temperatures higher than 1100° C. The present invention relates also to the use of such inventive coatings for applications in which the coating is exposed to temperatures above 1100° C.

In the context of the present invention the term "high temperatures" is used for referring to temperatures above 1100° C.

STATE OF THE ART

In the scientific article "Phase stability and elastic properties of titanium aluminum oxynitride studied by ab initio calculations" by Moritz to Baben, Leonard Raumann and Jochen M Schneider published in J. Phys. D: Appl. Phys. 46 (2013) 084002 (6pp), ab-initio calculation on TiAlON suggests a negative energy of mixing at 0K, i.e. likely solid solution formation between Fcc-$Ti_{0.5}Al_{0.5}N$ and fcc-$Ti_{0.5}Al_{0.5}O$. But this study does not provide any insights on high temperature stability of cubic phase in TiAlN.

OBJECTIVE OF THE PRESENT INVENTION

An objective of the present invention is to provide a coating comprising a metal nitride based PVD wear resistant coating for applications at high temperatures.

The metal nitride based coating should exhibit preferably following properties:
retaining a cubic metal nitride phase for enabling good mechanical properties,
good oxidation resistance,
low thermal conductivity, in particular lower than 5 W/mK,
good combination of toughness and hardness

DESCRIPTION OF THE PRESENT INVENTION

The objective of the present invention is attained by depositing transition metal aluminum nitride coatings (abbreviation: TM-Al—N coatings) comprising oxygen in a controlled manner. Hereafter called as "TM-Al—N coatings with controlled oxygen incorporation".

TM can be one or more transition metals.

According to a preferred embodiment of a coating according to the present invention titanium is used as transition metal i.e. TM=Ti.

For better understanding of the present invention, one example of a coating according to the above-mentioned preferred embodiment will be explained in more detail.

EXAMPLE 1

TiAlN and TiAlON coating layers were deposited by using 3 TiAl targets having chemical composition 50:50 in atomic percentage. The target material was arc evaporated in a coating device of the type Ingenia P3e™ manufactured by Oerlikon Balzers. The sources were operated at 190 A arc current. The substrate temperature during deposition of the coating layers was maintained at 450° C. Vacuum was drawn till a pressure lower than $3.0 \cdot 10^{-4}$ Pa. Nitrogen gas was used as reactive gas and the nitrogen partial pressure was maintained at 3.2 Pa. A negative bias voltage of −40 V was applied at the substrates to be coated. No oxygen gas flow was introduced in the coating chamber for deposition of the TiAlN coating layers. Oxygen gas flow was introduced in the coating chamber for the deposition of the TiAlON coating layers. Different TiAlON coating layers differing from each other in their oxygen content were deposited by adjusting a different oxygen gas flow. During deposition of each TiAlON layer the oxygen gas flow was maintained constant. Values of oxygen gas flows between 0 and 80 sccm were adjusted for the deposition of the different TiAlON coating layers. The element composition of the films, including the O-content in the deposited coating layers, was determined by using Elastic Recoil Detection Analysis (ERDA).

Both TiAlN and TiAlON were deposited exhibiting cubic phase.

The thermal stability of the cubic phase was analyzed.

The coated substrates were subjected to annealing at temperatures between 800° C. and 1300° C.

EXAMPLE 2

TiAlN and TiAlON coating layers were deposited by using 3 TiAl targets having chemical composition 40:60 in atomic percentage. The target material was arc evaporated in a coating device of the type Ingenia P3e™ manufactured by Oerlikon Balzers. The sources were operated at 120 A arc current and using confinement technology. The substrate temperature during deposition of the coating layers was maintained at 520° C. Vacuum was drawn till a pressure lower than $3.0 \cdot 10^{-4}$ Pa. Nitrogen gas was used as reactive gas and the nitrogen partial pressure was maintained at 6.0 Pa. A negative bias voltage of −40 V was applied at the substrates to be coated. No oxygen gas flow was introduced in the coating chamber for deposition of the TiAlN coating layers. Oxygen gas flow was introduced in the coating chamber for the deposition of the TiAlON coating layers. Different TiAlON coating layers differing from each other in their oxygen content were deposited by adjusting a different oxygen gas flow. During deposition of each TiAlON layer the oxygen gas flow was maintained constant. Values of oxygen gas flows between 0 and 80 sccm were adjusted for the deposition of the different TiAlON coating layers. The element composition of the films, including the O-content in the deposited coating layers, was determined by using Elastic Recoil Detection Analysis (ERDA).

Both TiAlN and TiAlON were deposited exhibiting cubic phase.

The thermal stability of the cubic phase was analyzed.

The coated substrates were subjected to annealing at temperatures between 800° C. and 1300° C.

FIGURE CAPTIONS

FIG. 1: Summary of the onset temperature of spinodal decomposed structure with fcc-cubic phase, and wurtzite phase formation as a function of Oxygen addition. (Data extracted from XRD patterns).

FIG. 2: XRD stacked as a function of annealing temperature for the AlTiN films, w-AlN precipitates (black arrow) already at 1000° C.

FIG. 3: XRD stacked as a function of annealing temperature for AlTiN with 13 at. % Oxygen. Surprisingly, w-AlN precipitates at 1300° C.

Figure 4:
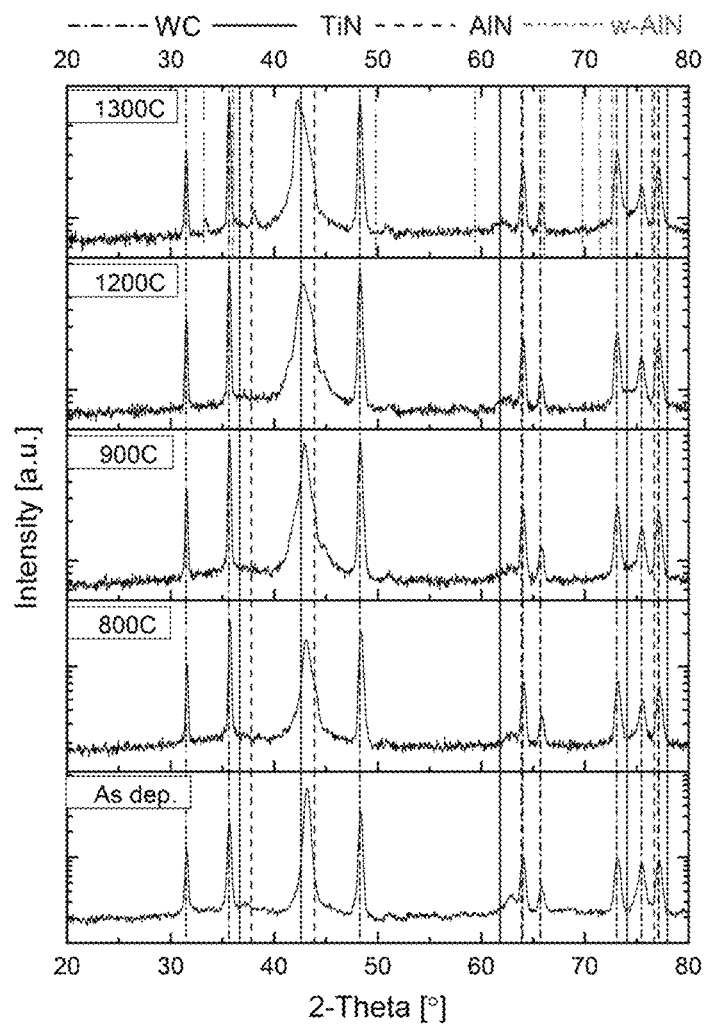

FIG. 4: XRD stacked as a function of annealing temperature for AlTiN with 13 at. % Oxygen. Same scale on the X-axis as in FIG. 2.

FIG. 5: STEM imaging of AlTiN film in as-deposited state.

FIG. 6: STEM imaging of AlTiN film annealed to 900° C. in spinodally decomposed structure.

FIG. 7: STEM imaging of AlTiN film annealed to 1000° C. —white areas indicate Al-segregation occurs uniform across the structure.

FIG. 8: STEM imaging of AlTiN film annealed to 1000° C. Higher magnification compared to FIG. 7.

FIG. 9: STEM imaging of AlTiON film with 13 at. % Oxygen in as-deposited state.

FIG. 10: STEM imaging of AlTiON film with 13 at. % Oxygen annealed to 900° C. in spinodally decomposed structure.

FIG. 11: STEM imaging of AlTiON film with 13 at. % Oxygen annealed to 1200° C. in spinodally decomposed structure.

FIG. 12: STEM imaging of AlTiON film with 13 at. % Oxygen annealed to 1300° C. —white areas indicate Al-segregation which occurs preferentially at grain boundaries.

FIG. 13: STEM imaging of AlTiN film annealed to 1300° C. Higher magnification compared to FIG. 12.

FIG. 14: STEM imaging of AlTiN film annealed to 1300° C. Higher magnification compared to FIG. 13.

Figure 15:
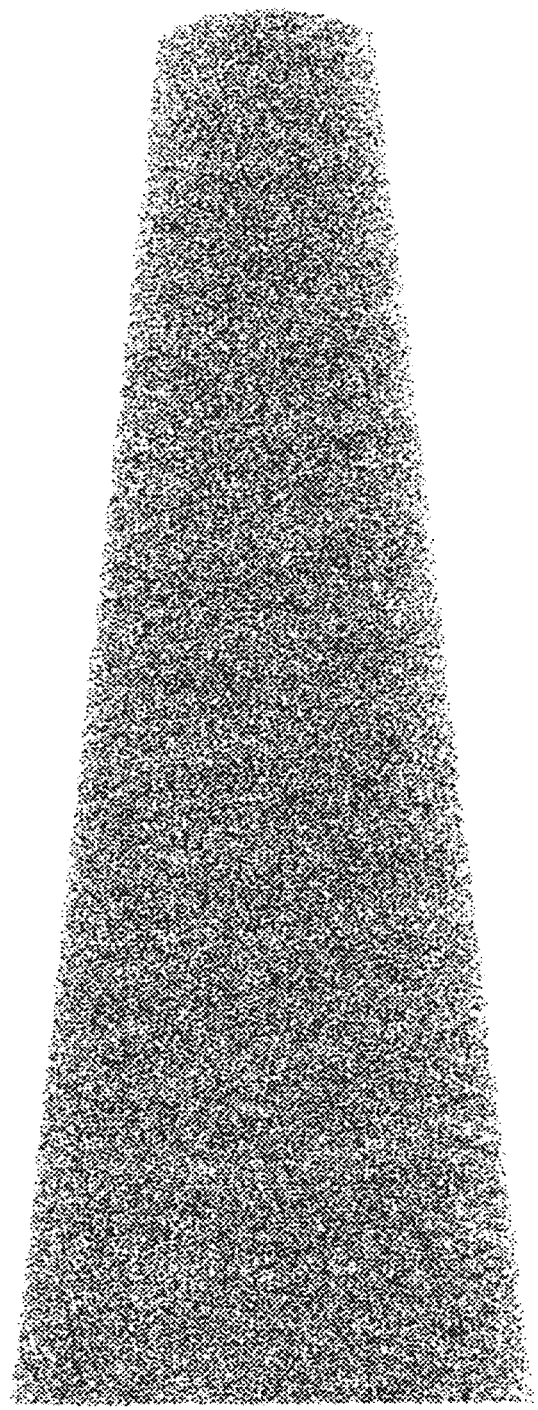

FIG. 15: Atomic probe tomography reconstruction of Al-atoms in a tip of 160 nm length cut out from AlTiN film in as-deposited state. The dots represent Al-atoms. The distribution of Al-atoms are random.

Figure 16:
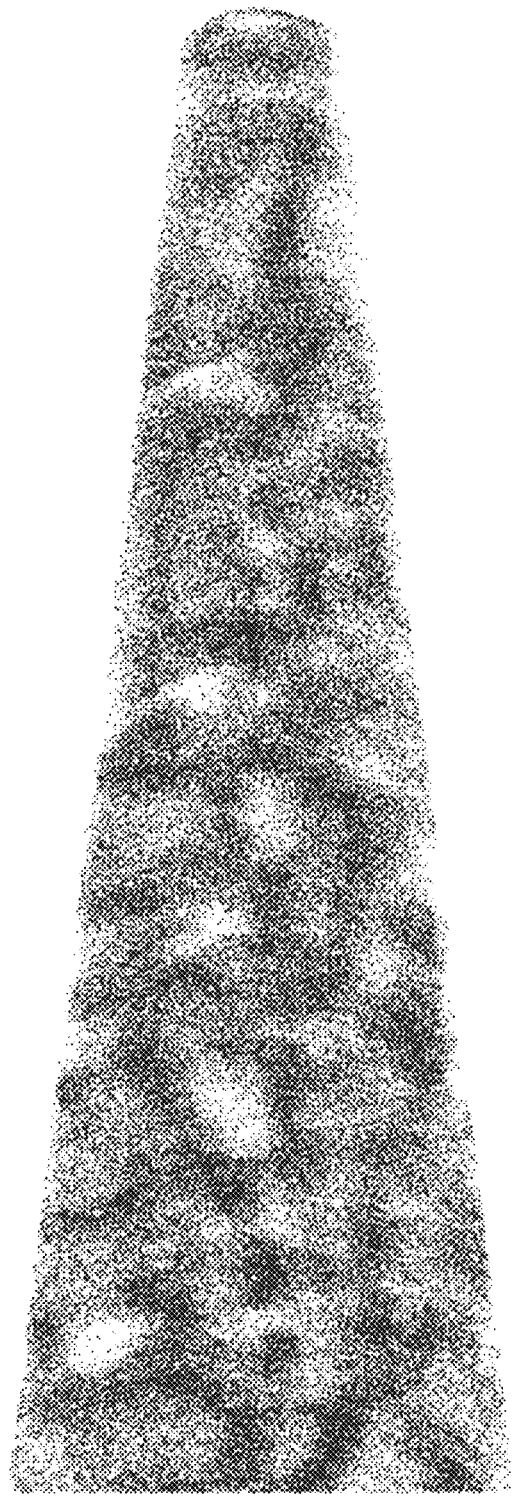

FIG. 16: Atomic probe tomography reconstruction of Al-atoms in a tip of 160 nm length cut out from AlTiN film annealed to 900° C. The dots represent Al-atoms. Segregation of Al-atoms within the structure has started.

Figure 17:

FIG. 17: Atomic probe tomography reconstruction of Al-atoms in a tip of 160 nm length cut out from AlTiN film annealed to 1000° C. The dots represent Al-atoms. A segregated structure is visible.

Figure 18:
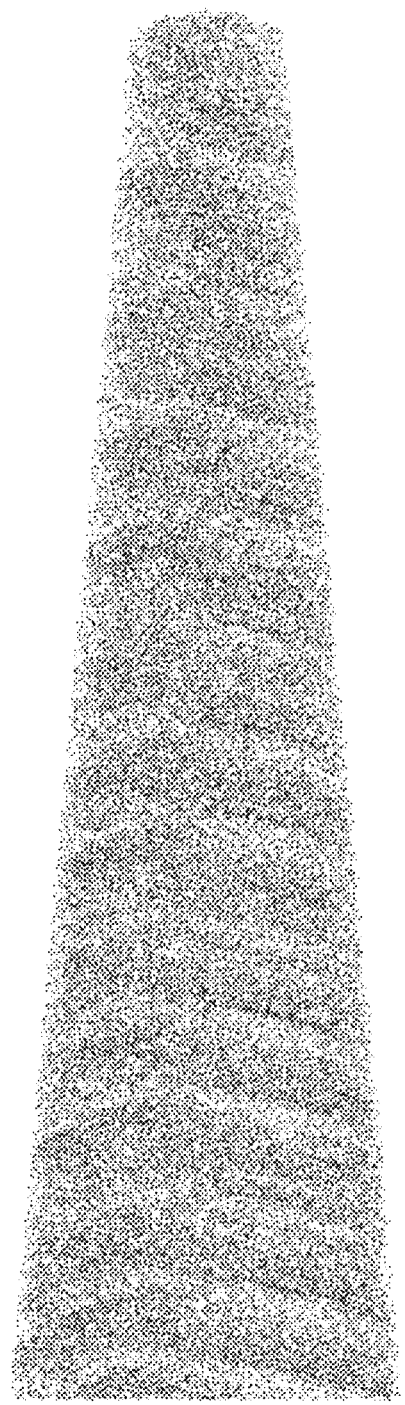

FIG. 18: Atomic probe tomography reconstruction of Al-atoms in a tip of 160 nm length cut out from of AlTiON film with 13 at. % Oxygen in as-deposited state. The dots represent Al-atoms. A layering effect is visible from sample rotation during the deposition. Apart from the rotational layering, the distribution of Al-atoms are random.

Figure 19:
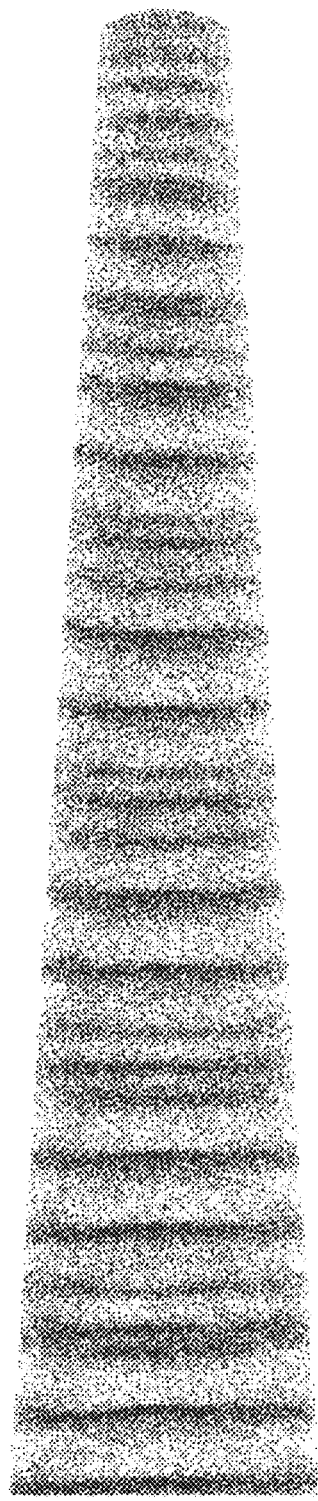

FIG. 19: Atomic probe tomography reconstruction of Al-atoms in a tip of 160 nm length cut out from AlTiON film with 13 at. % Oxygen annealed to 900° C. The dots represent Al-atoms. The layering from sample rotation during deposition is enhanced through the annealing.

Figure 20:
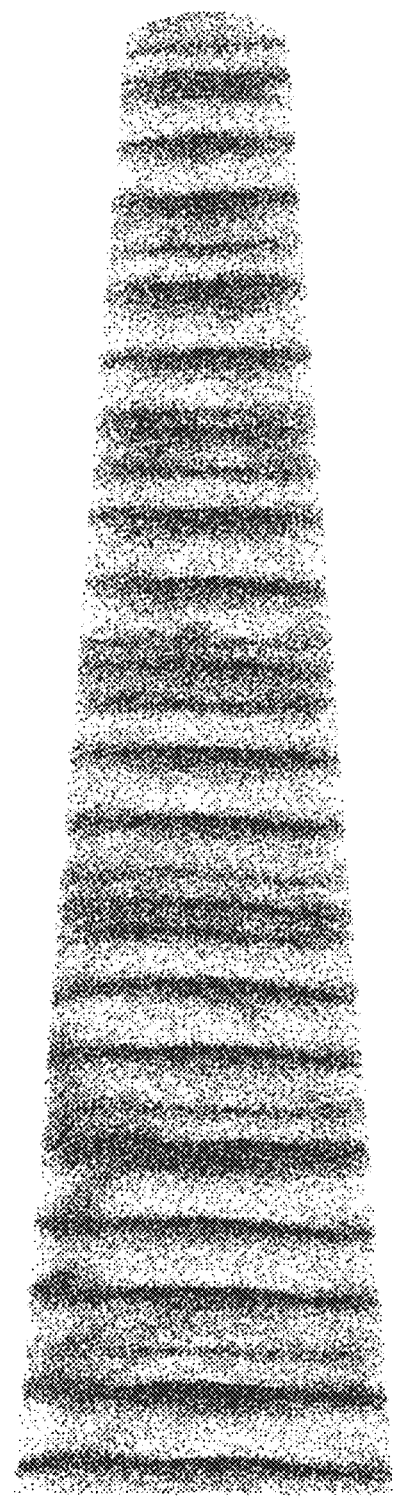

FIG. 20: Atomic probe tomography reconstruction of Al-atoms in a tip of 160 nm length cut out from AlTiON film with 13 at. % Oxygen annealed to 1200° C. The dots represent Al-atoms.

Figure 21:
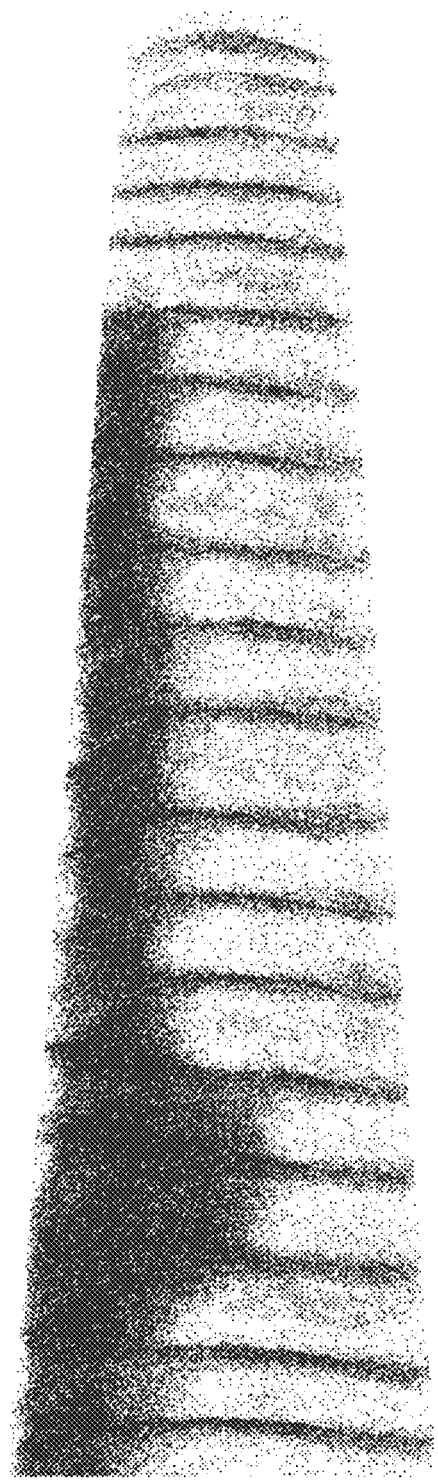

FIG. 21: Atomic probe tomography reconstruction of Al-atoms in a tip of 160 nm length cut out from AlTiON film with 13 at. % Oxygen annealed to 1300° C. The dots represent Al-atoms. Segregation of Al-atoms into a grain boundary region is visible on the left part of the picture.

Figure 22:
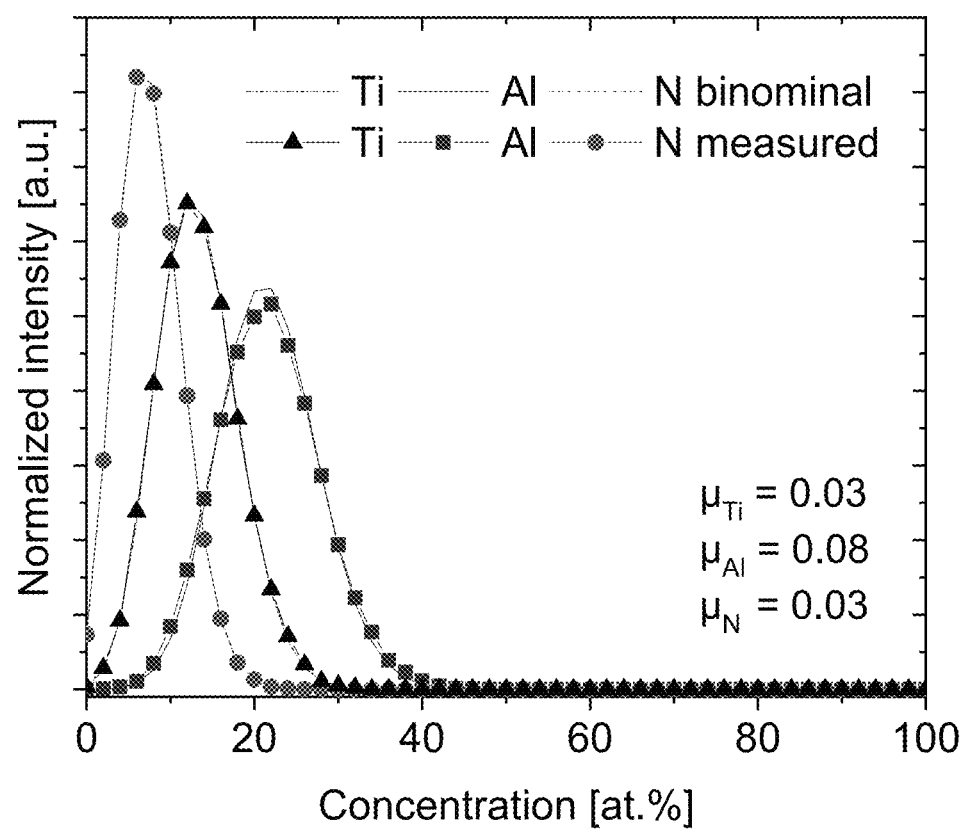

FIG. 22: Compositional distribution analysis and comparison to binominal, random distribution within the atom probe tomography reconstruction of the AlTiN film in as-deposited state. The Pearson correlation coefficient ($\mu$) close to zero indicate that Ti, Al, and N are distributed in a close to random fashion.

Figure 23:
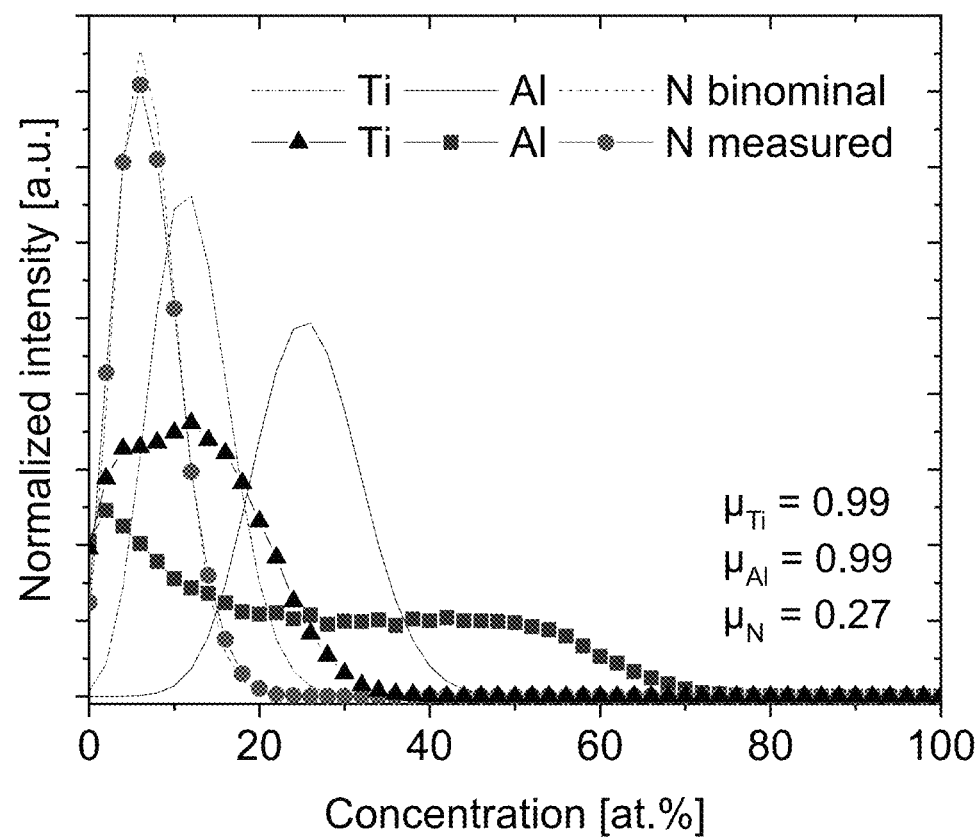

FIG. 23: Compositional distribution analysis and comparison to binominal, random distribution within the atom probe tomography reconstruction of the AlTiN film annealed to 900° C. The Pearson correlation coefficient ($\mu$) close to 1 for Ti and Al indicate a segregated structure.

Figure 24:
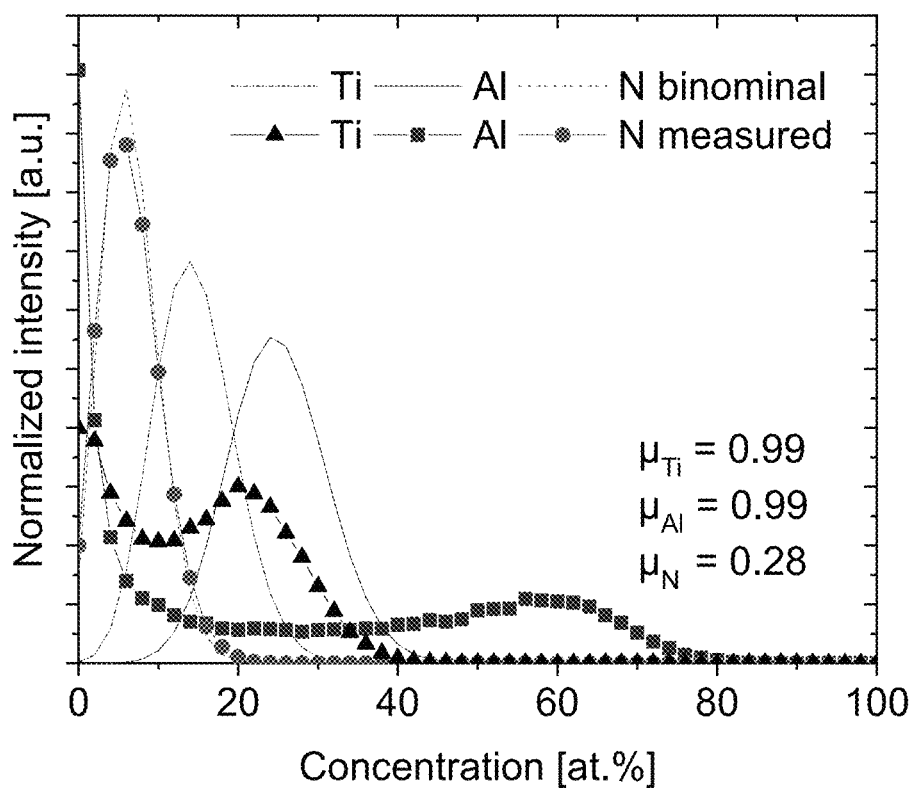

FIG. 24: Compositional distribution analysis and comparison to binominal, random distribution within the atom probe tomography reconstruction of the AlTiN film annealed to 1000° C. The Pearson correlation coefficient ($\mu$) close to 1 for Ti and Al indicate a segregated structure.

Figure 25:
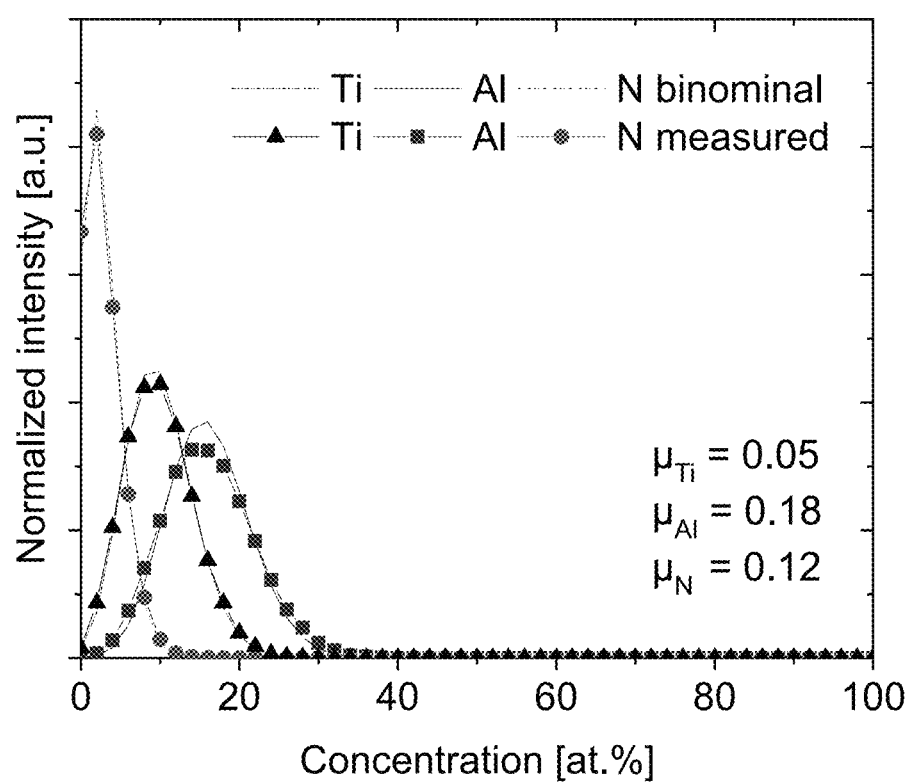

FIG. 25: Compositional distribution analysis and comparison to binominal, random distribution within the atom probe tomography reconstruction of the AlTiON film with 13 at. % Oxygen in as-deposited state. The low Pearson correlation coefficient ($\mu$) indicate that Ti, Al, and N are distributed in a close to random fashion.

Figure 26:
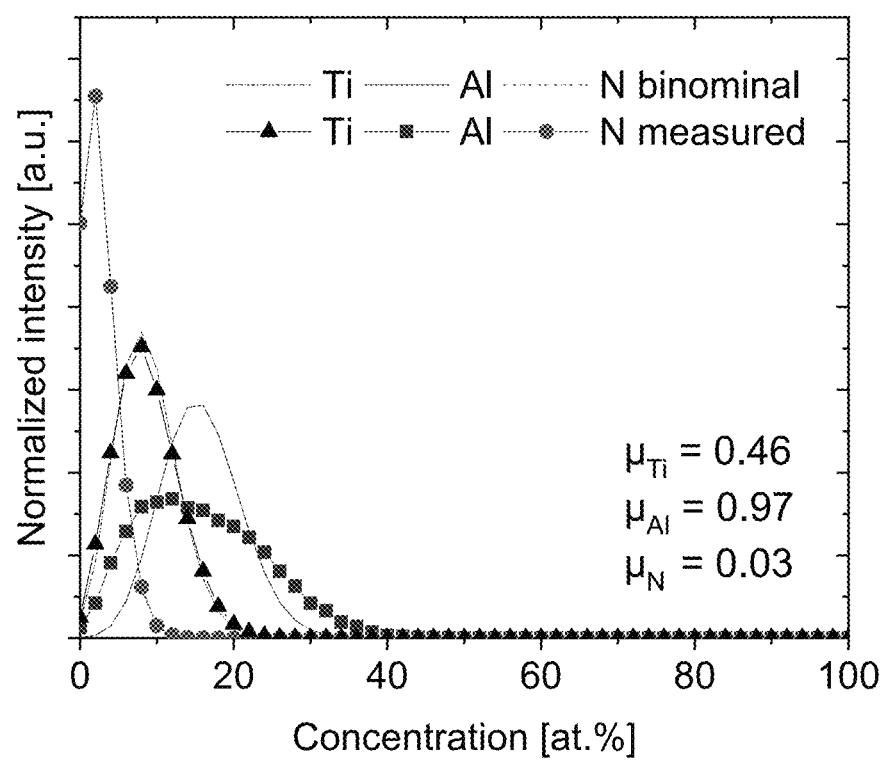

FIG. 26: Compositional distribution analysis and comparison to binominal, random distribution within the atom probe tomography reconstruction of the AlTiON film with 13 at. % Oxygen annealed to 900° C. The Pearson correlation coefficient (p) close to 1 for Al indicate segregation of Al.

Figure 27:
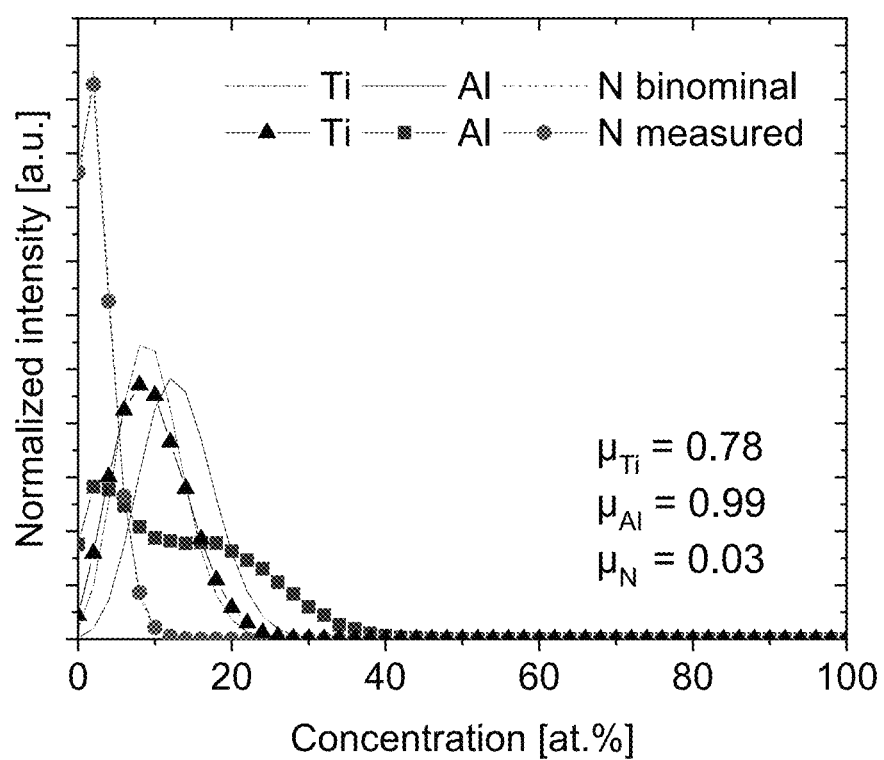

FIG. 27: Compositional distribution analysis and comparison to binominal, random distribution within the atom probe tomography reconstruction of the AlTiON film with 13 at. % Oxygen annealed to 1200° C. The Pearson correlation coefficient ($\mu$) close to 1 for Al indicate segregation of Al.

Figure 28:
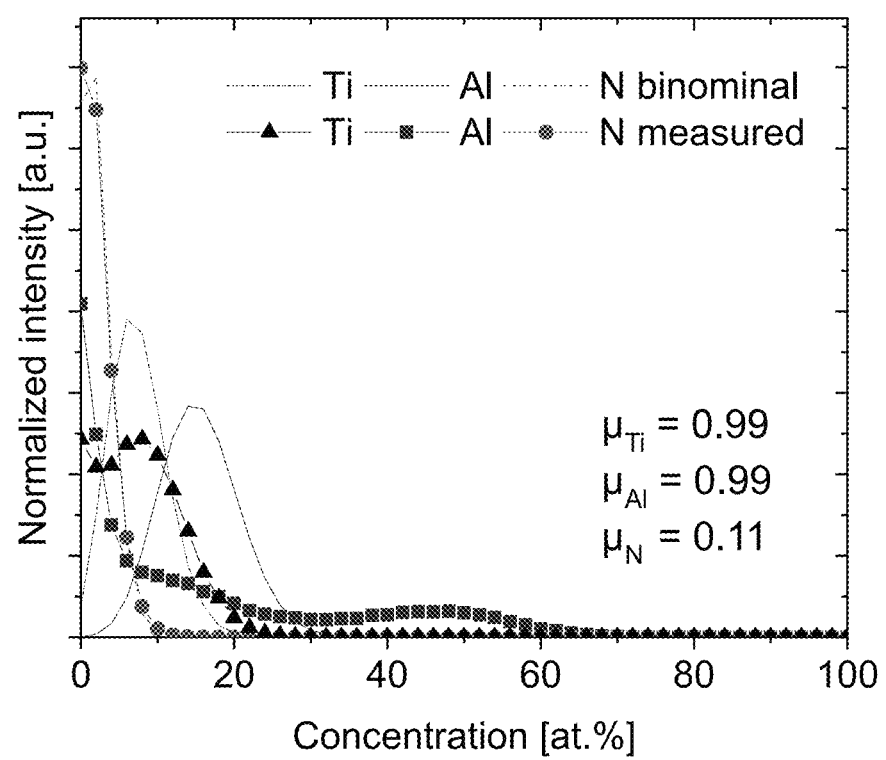

FIG. 28: Compositional distribution analysis and comparison to binominal, random distribution within the atom probe tomography reconstruction of the AlTiON film with 13 at. % Oxygen annealed to 1300° C. The Pearson correlation coefficient ($\mu$) close to 1 for Al and Ti indicate a segregated structure.

Figure 29:
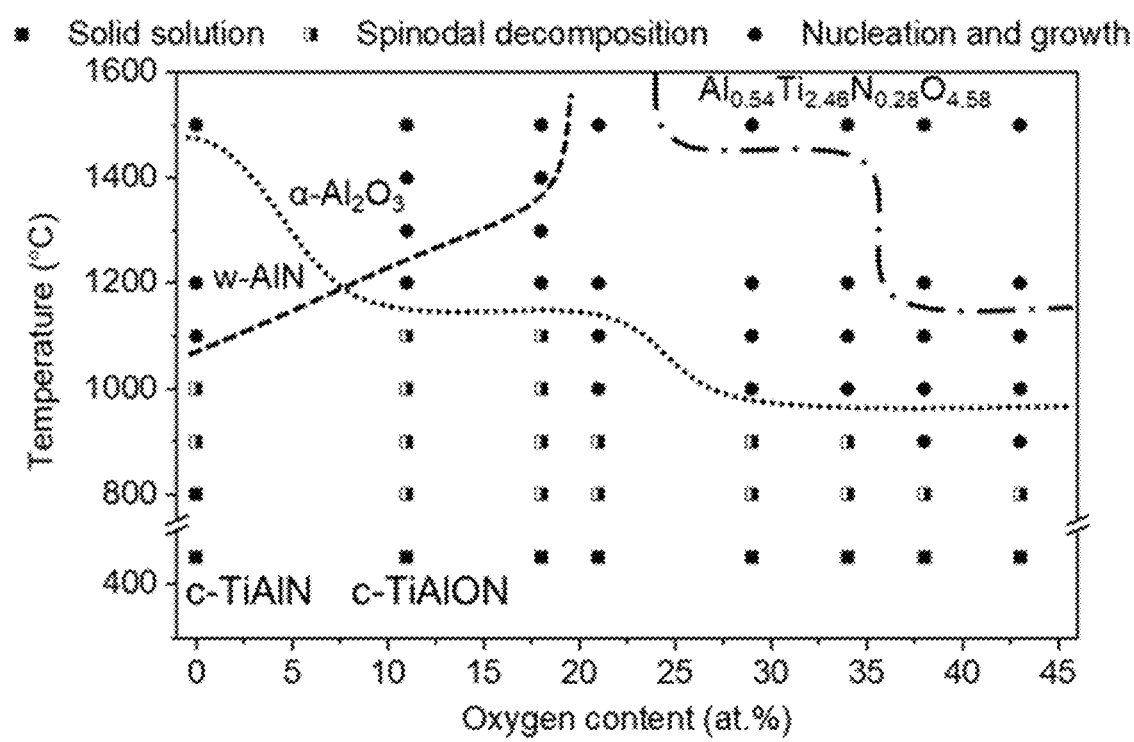

FIG. 29: Summary of the Phase structure as function of oxygen content and annealing temperature for films deposited Ti50Al50-targets (Data extracted from XRD patterns). Cubic solid solution is indicated by the filled squares, spinodal decomposed structure with fcc-cubic phase with half-filled squares, nucleation and growth of secondary phases are indicated with filled circles. The border for wurtzite phase formation is indicated by the "green" w-AlN line. Above 20 at % O, the thermal stability of the spinodally decomposed structure is limited by formation of secondary phases, particularly $TiO_2$. The films have been removed from the substrate and ground to a powder before annealing. The changed annealing conditions explain the detection of $\alpha$-$Al_2O_3$ for samples with 13 at. % O after 1200° C. annealing, compared with annealing of the films in FIG. 3 and FIG. 4, where $\alpha$-$Al_2O_3$ was not detected.

All measurements were performed on samples coated with the help of Ti50Al50 targets, however results are expected to be similar for other realistic target compositions (ranging from Ti20Al80 to Ti80Al20). It is preferred to have oxygen with more than 5 at % in the system. However, in general an oxygen atomic percentage above 25 at % is to be avoided, preferably a percentage above 20 at % is to be avoided and most preferred the oxygen percentage should be above 18 at % at most.

FIG. 1 shows the results of X-ray diffraction analysis of three kind of coated samples after annealing during 30 mins in vacuum atmosphere at 800° C., 900° C., 1000° C., 1100°

C. 1200° C. and 1300° C., respectively. The three kind of coated samples correspond to:
1. Samples coated with $(Ti_{0.5}Al_{0.5})O_yN_z$ having O-content=0 at. % (y=0), i.e. coated with $Ti_{0.5}Al_{0.5}N$ (deposited without introducing any oxygen gas flow in the coating chamber).
2. Samples coated with $(Ti_{0.5}Al_{0.5})O_yN_z$ having O-content=8 at. % if all elements (Ti, Al, O, N) are considered for the determination of the element composition i.e. y=0.16 (deposited by introducing oxygen gas flow in the coating chamber).
3. Samples coated with $Ti_{0.5}Al_{0.5}O_yN_z$ having O-content=13 at. % i.e. y=0.26 (deposited by introducing oxygen gas flow in the coating chamber).

For the $Ti_{0.5}Al_{0.5}N$ coating layer, wurtzite phase of aluminum nitride (abbreviation: w-AlN) precipitates already at 1000° C. In contrast, for oxygen containing coating layers of the type $Ti_{0.5}Al_{0.5}O_yN_{1-y}$ with y>0, w-AlN precipitates at a temperature higher than 1100° C., as it is shown in FIG. 1. For the showcases shown in FIG. 1, w-AlN precipitates at 1200° C. for $Ti_{0.5}Al_{0.5}O_yN_{1-y}$ with y=0.16 and at 1300° C. for $Ti_{0.5}Al_{0.5}O_yN_{1-y}$ with y=0.26.

The X-ray diffractograms of the $Ti_{0.5}Al_{0.5}N$ coating layers as deposited and after annealing at 800° C., 900° C., 1000° C. and 1100° C. are shown in FIG. 2.

The X-ray diffractograms of the $Ti_{0.5}Al_{0.5}O_yN_{1-y}$ coating layers with y=0.26 as deposited and after annealing at 800° C., 900° C., 1200° C. and 1300° C. are shown in FIG. 3.

The mechanical properties of the coating layers were investigated by nanoindentation. The $Ti_{0.5}Al_{0.5}O_yN_{1-y}$ film with y=0.26 had after deposition a hardness of 28-32 GPa, and elastic modulus (also called Young's modulus) of 400-470 GPa.

A surprisingly high enhancement of the thermal stability was attained by incorporation of oxygen in the structure for forming $TM_{1-x}Al_xO_yN_z$.

With an oxygen concentration of 13 at. % in $TM_{1-x}Al_xO_yN_z$ (y=0.26) the thermal stability in comparison with $TM_{1-x}Al_xN$ was significantly increased in such a manner that spinodally decomposed phases with cubic structure could be maintained till a temperature of 1200° C.

In this manner, the spinodally decomposed phases with cubic structure, that gives superior mechanical properties was stable over a higher temperature window (till additional 200° C. more—from 900° C. to 1200° C.) with controlled incorporation of oxygen, as it is shown in FIG. 1.

This let conclude that these kinds of inventive $TM_{1-x}Al_xO_yN_z$ coating layers can be very useful for applications at high temperatures, in particular if the oxygen concentration in the coating layer after deposition is about 13%.

Samples coated with Ti40Al60-targets, according to Example 2, were as well investigated by X-ray after annealing during 30 mins in vacuum atmosphere at 800° C., 900° C., 1000° C., 1100° C. 1200° C. and 1300° C., respectively. The following observations were made with respect to the w-AlN formation:
1. Samples coated with $(Ti_{0.4}Al_{0.6})O_yN_z$ having O-content=0 at. % (y=0), i.e. coated with $Ti_{0.4}Al_{0.6}N$ (deposited without introducing any oxygen gas flow in the coating chamber) shows formation of w-AlN after annealing to 1100° C.
2. Samples coated with $(Ti_{0.4}Al_{0.6})O_yN_z$ having O-content=6 at. % if all elements (Ti, Al, O, N) are considered for the determination of the element composition i.e. y=0.12 (deposited by introducing oxygen gas flow in the coating chamber), shows formation of w-AlN after annealing to annealing to 1300° C., i.e. 200° C. higher compared to samples without oxygen.
3. Samples coated with $(Ti_{0.4}Al_{0.6})O_yN_z$ having O-content=8 at. % if all elements (Ti, Al, O, N) are considered for the determination of the element composition i.e. y=0.16 (deposited by introducing oxygen gas flow in the coating chamber), shows formation of w-AlN after annealing to annealing to 1300° C., i.e. 200° C. higher compared to samples without oxygen.
4. Samples coated with $(Ti_{0.4}Al_{0.6})O_yN_z$ having O-content=22 at. % if all elements (Ti, Al, O, N) are considered for the determination of the element composition i.e. y=0.44 (deposited by introducing oxygen gas flow in the coating chamber), shows formation of w-AlN after annealing to annealing to 1300° C., i.e. 200° C. higher compared to samples without oxygen.

A similar behavior can be expected for other TiAlN coating films having different Ti:Al ratios and also for other kinds of TM-Al—N coating films, for example CrAlN, VaAlN and NbAlN.

The coatings according to the present invention are particularly beneficial for coating surfaces of tools or components, which are to be used in applications involving exposition of surfaces of the tools or components to temperatures exceeding 1100° C.

The inventors suggest using these coatings for example for protecting and improving performance of components or tools used in:
(a) aero engine high pressure turbines or aero engine high pressure turbine sealing,
(b) machining of difficult-to-cut materials, e.g. nickel base super alloys such as Inconel 718,
(c) high temperature forming operations like rolling and forging operating at temperatures above 1100° C.

Additional insights into the structure evolution of TiAlN and TiAlON coatings is gained by analysis of as-deposited and annealed samples with scanning transmission electron microscopy (STEM) and atomic probe tomography (APT).

In as-deposited state, STEM-imaging of TiAlN (FIG. 5) and TiAlON (FIG. 9) reveal a columnar structure. After annealing to 900° C., the spinodally decomposed structure show a maintained columnar structure for TiAlN (FIG. 6) as well as TiAlON (FIG. 10). When the TiAlN-coatings are annealed to 1000° C., the segregation of w-AlN is seen in STEM-imaging (FIG. 7, and FIG. 8 with higher magnification) as bright features that are distributed across the crystalline grains. TiAlON, on the contrary, show after annealing to 1300° C., and formation of w-AlN, segregation preferentially at grain boundaries as revealed by STEM images FIG. 12 and higher magnification in FIG. 13 and FIG. 14.

Atomic probe tomography shows a random structure of Al-atoms in TiAlN as deposited (FIG. 15). Upon annealing to 900° C. (FIG. 16), and 1000° C. (FIG. 17), the segregation of Al throughout the tip can be followed.

TiAlON shows in as-deposited state layering as an effect of substrate rotation during deposition (FIG. 18). This layering effect is enhanced as an increase of Al-content at the rotation boundaries after annealing to 900° C. (FIG. 19) and 1200° C. (FIG. 20). After annealing to 1300° C., a strong segregation of Al is seen in the left part of the reconstructed tip (FIG. 21).

Compositional distribution analysis of atomic probe tomography data is a further method to follow decomposition. This technique and the application of Pearson coefficients (p) has been described by M. P. Moody et. al. in the scientific paper "Quantitative Binomial Distribution Analyses of Nanoscale Like-Solute Atom Clustering and Segregation in Atom Probe Tomography Data", published in the journal Microscopy Research and Technique volume 71, pages 542-550. For TiAlN (FIG. 22) and TiAlON (FIG. 25) in as-deposited state, Pearson coefficients (p) close to 0 indicate a solid solution with close to random distribution. TiAlON has slightly higher values for µ(Al) due to the layering during deposition as seen in the APT reconstruction (as shown in FIG. 18).

After annealing to 900° C., the TiAlN coatings show Pearson coefficients for Ti and Al close to 1, indicating segregation in the spinodally decomposed structure (FIG. 23). TiAlON annealed to the same temperature (FIG. 26) show lower values of the Pearson coefficient for Ti, indicating less segregation compared to TiAlN.

The decomposed structure is characterized by Pearson coefficients close to 1 for Ti and Al, as seen in TiAlN after annealing to 1000° C. (FIG. 24) and in TiAlON after annealing to 1300° C. (FIG. 28).

Layers with the same chemical composition can have different crystalline phases, in particular a layer as claimed in claim 1 can exhibit a solid solution with B1 cubic structure or a layer as claimed in claim 2 can exhibit a spinodally decomposed phases with cubic structure. Layer growth and crystalline phase formation in PVD (Physical Vapor Deposition) is a complex process that can be influenced by several factors. Among the most important parameters besides composition: temperature, process pressure, bias, and degree of ionization. Furthermore, the thermal history has a decisive influence—if the layer is kept at a tempering temperature above the coating temperature, it can change the phase structure. This is the case for the difference between the substrate claimed in claim 1 and the substrate claimed in claim 2, as can also be seen in the text in FIG. 1:

In the coated state the single-phase cubic structure is present (solid solution)—which is claimed in claim 1

After tempering temperatures in the range of preferably 800° C. to 900-1300° C., which preferably depends on the O-content, spinodal segregation into the cubic structures has taken place. Therefore, spinodally decomposed phases with cubic structure can be made, which is claimed in claim 2.

TiAlON coatings according to a preferred embodiment of the present invention were found to exhibit crystalline grains having a crystalline grain size, which is also known as domain size, that is in the range of 5 to 50 nm and preferably of 15 to 35 nm, which was determined by XRD (X-ray diffraction). This quantification was done according to a standard method (Sherrer's equation), based on the XRD patterns given in FIG. 3.

TiAlON coatings preferably have atoms distributed in a close to random fashion
  i. characterized by a Pearson coefficient for Ti ($\mu$Ti)<0.20
  ii. characterized by a Pearson coefficient for Al ($\mu$Al) <0.20
  iii. characterized by a Pearson coefficient for N ($\mu$N)<0.20
FIG. 25 shows the concentration distributions with data obtained by atom probe tomography.

TiAlON coatings preferably contain a periodic modulation of composition, in particular have a modulation of Al content. Furthermore, it is preferred that the compositional modulation has a periodicity of 5-30 nm, preferably ~10 nm. This can be seen in particular in FIG. 18 and FIG. 19.

The invention claimed is:

1. A coated substrate comprising:
a surface coated with a PVD-deposited coating comprising at least one PVD-deposited coating layer of $(TM_{1-x}Al_x)O_yN_{y-1}$, exhibiting solely solid solution with solely B1 cubic structure or exhibiting solely spinodally decomposed phases with cubic structure, wherein x is a content of aluminum in atomic fraction if only aluminum and TM are being considered for a determination of element composition in atomic percentage, and y is a content of oxygen in atomic fraction if only O and N are being considered for the determination of the element composition in atomic percentage, wherein TM is one or more transition metals, and TM=Ti,
x=0.5, and
y is in a range of 0.25<y<0.35, thereby corresponding to a value of oxygen concentration in the $(TM_{1-x}Al_x)O_yN_{y-1}$ coating layer that produces an increment of thermal stability in such a manner that no precipitation of w-AlN phase is produced when the coated substrate or at least the coated surface of the coated substrate is exposed to temperatures higher than 1100° C. and lower than 1300° C.

2. The coated substrate according to claim 1, wherein the substrate is a forming tool.

3. The coated substrate according to claim 1, wherein the substrate is a cutting tool.

4. The coated substrate according to claim 1, wherein the substrate is a component of an aero engine high pressure turbine or an aero engine high pressure turbine sealing.

5. The coated substrate according to claim 1, wherein the $TM_{1-x}Al_xO_yN_z$ coating layer exhibits crystalline grains having a crystalline grain size in a range of 5 to 50 nm, which is obtained by XRD (X-ray diffraction).

6. The coated substrate according to claim 1, wherein the $TM_{1-x}Al_xO_yN_z$ coating layer has atoms distributed in a close to random fashion
  i. with a Pearson coefficient for Ti ($\mu$Ti)<0.20, and
  ii. with a Pearson coefficient for Al ($\mu$Al)<0.20, and
  iii. with a Pearson coefficient for N ($\mu$N)<0.20.

7. The coated substrate according to claim 1, wherein the $TM_{1-x}Al_xO_yN_z$ coating layer has a compositional modulation with a periodicity of 5-30 nm.

8. The coated substrate according to claim 1, wherein the $TM_{1-x}Al_xO_yN_z$ coating layer has a hardness in a range of 25-35 GPa and an elastic modulus in a range of 300-500 GPa.

9. A method of using the coated substrate according to claim 2, comprising using the forming tool in a high temperature forming operation.

10. A method of using the coated substrate according to claim 3, comprising using the cutting tool in a cutting operation involving machining of a difficult-to-cut material.

* * * * *